United States Patent [19]

Iguchi et al.

[11] Patent Number: 5,495,126
[45] Date of Patent: Feb. 27, 1996

[54] POLYCRYSTALLINE DIAMOND HEAT SINK HAVING MAJOR SURFACES ELECTRICALLY INSULATED FROM EACH OTHER

[75] Inventors: Takahisa Iguchi; Tsutomu Nakamura; Tetsuo Nakai, all of Hyogo, Japan

[73] Assignee: Sumitomo Electric Industries, Ltd., Osaka, Japan

[21] Appl. No.: 181,680

[22] Filed: Jan. 14, 1994

Related U.S. Application Data

[62] Division of Ser. No. 964,390, Oct. 20, 1992, Pat. No. 5,294,381.

[30] Foreign Application Priority Data

Oct. 21, 1991 [JP] Japan ................. 3-272830

[51] Int. Cl.⁶ .................. H01L 23/34; H01L 31/0312
[52] U.S. Cl. ................ 257/717; 257/77; 257/739; 361/708
[58] Field of Search ................ 257/77, 712, 717, 257/739, 713; 361/708

[56] References Cited

U.S. PATENT DOCUMENTS

| | | | |
|---|---|---|---|
| 4,595,603 | 6/1986 | Davies et al. | 427/82 |
| 4,972,250 | 11/1990 | Omori et al. | 257/631 |
| 4,981,818 | 1/1991 | Anthony et al. | 437/233 |
| 5,087,959 | 2/1992 | Omori et al. | 257/635 |
| 5,146,314 | 9/1992 | Pankove | 257/712 |
| 5,294,381 | 3/1994 | Iguchi et al. | 264/25 |

FOREIGN PATENT DOCUMENTS

| | | |
|---|---|---|
| 0142282 | 5/1985 | European Pat. Off. . |
| 57-060861 | 4/1982 | Japan . |
| 60-127750 | 7/1985 | Japan . |
| 2-268917 | 11/1990 | Japan . |
| 3-138106 | 6/1991 | Japan . |

*Primary Examiner*—Rolf Hille
*Assistant Examiner*—David Ostrowski
*Attorney, Agent, or Firm*—W. G. Fasse; W. F. Fasse

[57] ABSTRACT

A polycrystalline diamond is prepared by chemical vapor deposition (step 101). A surface of the polycrystalline diamond is metallized (step 102). The metallized surface of the polycrystalline diamond is grooved with a YAG laser (step 103). A wedge or the like is driven into the grooves of the polycrystalline diamond to pressurize the same, whereby the polycrystalline diamond is divided along the grooves (step 104). Alternatively, a surface of a polycrystalline diamond prepared by chemical vapor deposition is grooved with a YAG laser (step 112), and the surface of the polycrystalline diamond is metallized (step 113) after the grooving. The obtained diamond heat sink (10) includes a first layer (11a) grooved with a laser, and a mechanically divided second layer (11b). Graphite adheres to the outer peripheral surface of the first layer (11a). The outer peripheral surface of the second layer (11b) has a greater surface roughness than that of the first layer (11a).

20 Claims, 5 Drawing Sheets

POLYCRYSTALLINE DIAMOND HEAT SINK HAVING MAJOR SURFACES ELECTRICALLY INSULATED FROM EACH OTHER

CROSS-REFERENCE TO RELATED APPLICATIONS

This is a DIVISIONAL of U.S. patent application Ser. No. 07/964,390 filed Oct. 20, 1992, now U.S. Pat. No. 5,294,381 issued Mar. 15, 1994.

BACKGROUND OF THE INVENTION

1. Field of the Invention

The present invention relates to a diamond heat sink. More particularly, a diamond heat sink is produced to contain diamond made by chemical vapor deposition.

2. Background Information

A heat sink (radiator) is adapted to efficiently dissipate heat which is generated in operation of a device such as a semiconductor laser diode, and LED (light emitting diode), a semiconductor high frequency device or the like. The material for such a heat sink is selected in accordance with the heat produced by the device to which the heat sink is applied. Table 1 shows physical properties to various heat sink materials.

TABLE 1

| Physical Properties | Monocrystalline Diamond | Vapor-Deposited Diamond | cBN Sintered Body | Cu | Sic | Cu—W | BeO | AlN | Si |
|---|---|---|---|---|---|---|---|---|---|
| Density (g/cm$^2$) | 3.52 | 3.52 | 3.49 | 8.9 | 3.1 | 16.4 | 2.9 | 3.26 | 2.3 |
| Vickers Hardness (kg/mm$^2$) | 12,000 | 12,000 | 6,000 | 80 | — | 260 | 1,200 | 1,200 | — |
| Transverse Rapture Strength (kg/mm$^3$) | 400 | 200 | — | — | 40 | 136 | 20 | 30 | — |
| Thermal Conductivity (W/m · K) | 2,000 | 1,000 | 600 | 390 | 270 | 250 | 250 | 200 | 140 |
| Thermal Expansion Coefficient ($\times 10^{-6}$/°C.) | 2.3 | — | 3.7 | 16.5 | 3.7 | 8.5 | 7.6 | 4.5 | 4.2 |
| Specific Heat (cal/g · °C.) | 0.122 | — | — | 0.092 | — | 0.044 | 0.25 | 0.16 | 0.18 |
| Electric Resistivity ($\Omega$ · cm) | $10^{16}$ | $5 \times 10^9$ | $10^{11}$ | $1.7 \times 10^{-6}$ | $10^{13}$ | $3.4 \times 10^{-6}$ | $10^{15}$ | $10^{13}$ | $2.3 \times 10^5$ |
| Dielectric Constant (1 MH$_2$) | 5.7 | 6.5 | 6.5 | — | 40 | — | 6.7 | 8.9 | — |

As shown in Table 1, diamond has a high thermal conductivity. Therefore, a diamond heat sink is employed as a heat dissipating part for a device having a high heating value such as high power semiconductor lasers for communication, optical memories solid state laser pumping devices or the like, for example. Presently, such a diamond heat sink is mainly made of natural or synthetic monocrystalline diamond.

Figure 7:
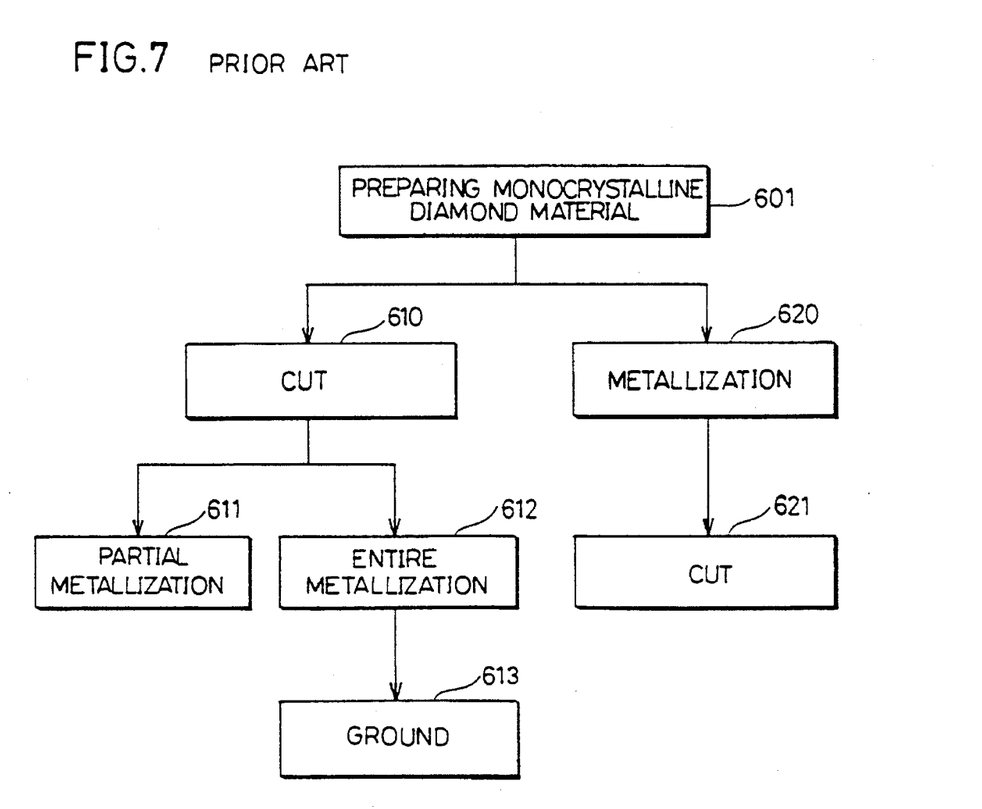
FIG. 7 is a process diagram schematically showing a conventional method of manufacturing a diamond heat sink.

FIG. 7 is a process diagram successively showing steps in conventional methods of manufacturing diamond heat sinks. Referring to FIG. 7, a monocrystalline diamond material is prepared by high pressure synthesis or the like (step 601). According to a first manufacturing method, this monocrystalline diamond material is cut into chips with a diamond saw (step 610). The cut diamond chips are arranged side by side with no clearances and metallized (step 611), so that only upper and bottom surfaces of each diamond chip are metallized.

According to a second manufacturing method, on the other hand, a monocrystalline diamond material is cut into chips with a diamond saw (step 610), similarly to the first manufacturing method. Each of the cut diamond chips is metallized on all faces (step 612). Side surfaces of the entirely metallized diamond chip are ground with a diamond grindstone (step 613), so that metallized films are left only on upper and bottom surfaces of the diamond chip.

According to a third manufacturing method, a monocrystalline diamond material is metallized before cutting (step 620). The metallized monocrystalline diamond material is cut with a diamond saw into chips, each of which is then cut into a final shape (step 621).

Conventional diamond heat sinks are manufactured in the above manners.

In each of the aforementioned conventional methods of manufacturing diamond heat sinks, a monocrystalline diamond material is cut with a diamond saw. Therefore, the diamond material cannot be cut with a high accuracy, and the cutting speed is very slow. Further, a great deal of waste results from the cutting and grinding steps, leading to an inferior yield. Thus, a diamond heat sink cannot be easily manufactured by a conventional method, leading to inferiority in mass productivity.

On the other hand, each of Japanese Patent Laying-Open Nos. 2-268917 (1990) and 3-138106 (1990) discloses a method of working a monocrystalline diamond material without using a diamond saw.

SUMMARY OF THE INVENTION

Its is an object of the present invention to provide a method of manufacturing a diamond heat sink, which can easily work a diamond material with an excellent yield while providing a high mass productivity.

Another object of the present invention is to provide a diamond heat sink which is insulated between the upper and the bottom faces.

In order to attain the aforementioned first object, the method of the invention is adapted to manufacturing a diamond heat sink containing diamond which is synthesized by chemical vapor deposition and having a pair of opposing main surfaces which are electrically insulated from each other. This method includes a step of preparing a polycrystalline diamond, a step of forming grooves in surfaces of the polycrystalline diamond, and a step of mechanically dividing the polycrystalline diamond along the grooves.

According to the present method of manufacturing a diamond heat sink, it is possible to simultaneously divide the polycrystalline diamond along the grooves into many sections. Thus, the diamond material can be easily worked in a shorter time. Further, cutting waste or margins result only from the grooves, whereby the yield is improved. Thus, the manufacturing costs are reduced by a reduction of the working time and by an improvement of the yield.

Preferably, the step of forming grooves is carried out with a YAG (yttrium aluminum garnet) laser. Due to such employment of the laser, it is possible to accurately and efficiently work the diamond material.

In order to attain the aforementioned second object, the diamond heat sink according to the present invention contains polycrystalline diamond which is synthesized by vapor deposition and has a pair of opposing main surfaces which are electrically insulated from each other. The diamond heat sink includes first and second layers between the pair of main surfaces. Graphite adheres to the outer peripheral surface of the first layer and the outer peripheral surface of the second layer has a greater surface roughness than that of the first layer.

If the diamond heat sink includes only the first layer, graphite will remain, so that insulation can not be obtained between the two main surfaces. The diamond heat sink according to the present invention obtained by forming a groove to divide the polycrystalline diamond along the groove inevitably has a second layer to which graphite does not adhere and then, the insulation between the two main surfaces can be maintained.

Preferably, a defect, such as chipping, in an edge of the second layer is not more than 50 μm in size.

In general, such an edge is used for locating a soldering for a laser diode chip or the like. When a large defect exceeding 50 μm is caused in this edge, it is difficult to locate the laser diode chip or the like. Further, such a large defect leads to a reduction in the heat dissipating property.

Preferably, the electric resistance along the direction of thickness of the second layer is at least $10 \times 10^6 \Omega$.

In general, a semiconductor laser requires an electric resistance of $1 \times 10^6 \Omega$, and characteristics of the semiconductor laser deteriorate when the resistance is less than the above value.

Preferably, the electric resistance across the pair of main surfaces of the diamond heat sink is $1 \times 10^6 \Omega$.

Preferably, the second layer has a thickness of at least 0.03 mm and not more than 0.3 mm. In order to attain an electric resistance of at least $1 \times 10^6 \Omega$ along the direction of thickness of the second layer, it is necessary to make its thickness at least 0.03 mm. As the thickness of the second layer is increased, however, a defect in the edge is easily caused in the second layer when the diamond is divided and also such a defective portion is increased in size. In order to suppress the defective portion which is caused in an edge of the second layer, to not more than 50 μm in size, it is necessary to make the thickness of the second layer not more than 0.3 mm.

Preferably, the polycrystalline diamond has an electric resistivity of $10^9$ Ω·cm. Such an electric resistivity of at least $10^9$ Ω·cm is at least necessary for attaining an electric resistance of at least $1 \times 10^6 \Omega$ along the direction of thickness of the second layer.

Preferably, the polycrystalline diamond has a thermal conductivity of at least 5 W/cm·K and not more than 20 W/cm·K at room temperature. Due to restrictions set by a conventional apparatus and by the method for preparing polycrystalline diamond, the upper limit of the thermal conductivity of diamond is 20 W/cm·K. In order to apply diamond which provides a high performance as a heat sink, the lower limit of its thermal conductivity is preferably at least 5 W/cm·K.

The polycrystalline diamond which is synthesized by chemical vapor deposition preferably has a thermal conductivity of at least 5 W/cm·K in a temperature range from room temperature to 200° C. Further, the grain diameter of the polycrystalline diamond is preferably not more than 50 μm, so that substantially fewer defects are caused when the polycrystalline diamond is divided.

Preferably, the diamond heat sink includes a metallized film, which is formed at least on all or a portion of at least one of the pair of main surfaces. This metallized film is required for soldering a laser diode chip, as well as for soldering the heat sink itself to a stem.

Preferably, the metallized film includes a first film which is formed on at least one of the pair of main surfaces and a second film which is formed on the surface of the first film.

Preferably, the first film included in the metallized film is made of at least one element selected from a group of Ti, Cr, W and Ni, while the second film is made of at least one element selected from a group of Pt, Pd, Ni, Mo, Au, Ag, Cu, Sn, In, Ge and Pb.

The first film is adapted to react with the diamond to improve adhesion. A metal material for serving such a function of the first film is selected from at least one element selected from a group of Ti, Cr, W and Ni. The second film is adapted to contribute to a low heat resistance and solderability. A metal material for serving such a function of the second film is prepared from at least one element selected from a group of Pt, Pd, Ni, Mo, Au, Ag, Cu, Sn, In, Ge and Pb.

The completed heat sink has standard dimensions of at least 0.1 mm and not more than 1 mm in thickness and at least 0.2 mm and not more than 50 mm in length and width.

A polycrystalline diamond is employed in the diamond heat sink of the invention and in the present method of manufacturing the same, to avoid the following problems that are caused if a monocrystalline diamond is employed. A polycrystalline diamond has a transverse rupture strength of 200 kg/mm², while a monocrystalline diamond has a higher transverse rupture strength of 400 kg/mm², whereby it becomes difficult to divide a monocrystalline diamond. On the other hand, a polycrystalline diamond is broken mainly along grain boundaries, while a monocrystalline diamond is cleaved along the (111) plane. Therefore, the monocrystalline diamond is easier to crack which, however, leads to a large defect. Thus, the yield is reduced. Further, a polycrystalline diamond provides a material having a large surface area, while a monocrystalline diamond attains an area of about 5 mm by 5 mm at the most. Thus, the monocrystalline diamond is inferior in productivity.

As hereinabove described, a monocrystalline diamond has various problems. Therefore, a polycrystalline diamond is employed in the present method of manufacturing such diamond heat sinks.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 2A:
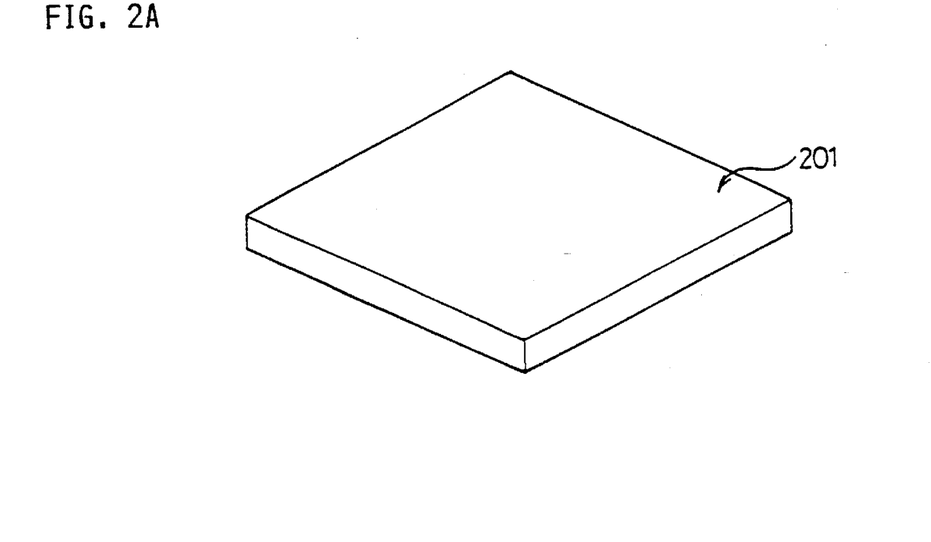
FIGS. 2(a) to 2(c) are perspective views showing the steps of manufacturing a diamond heat sink according to the present invention.
Figure 2B:
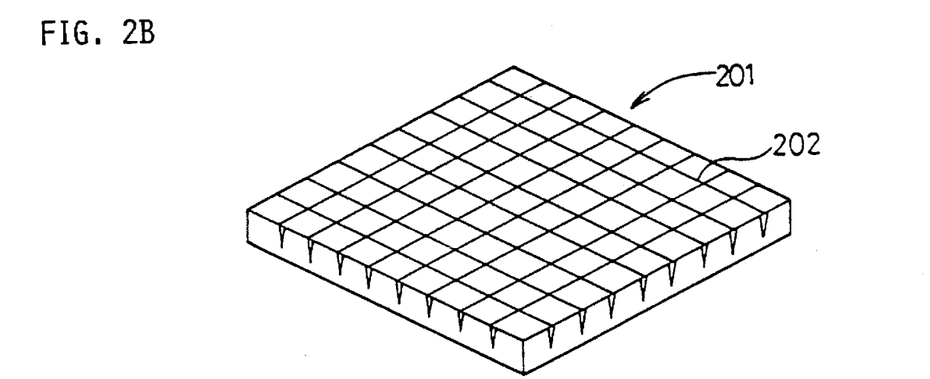
Figure 2C:
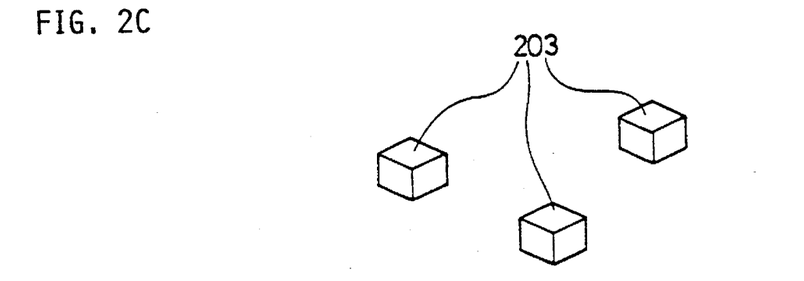

With reference to FIGS. 1(a) and 2(a) to 2(c), a first process of manufacturing diamond heat sinks will now described. First, a polycrystalline diamond 201 is produced by chemical vapor deposition (step 101). Referring to FIG. 2(a), the polycrystalline diamond 201 is metallized, so that a metallized film is formed over the entire surface of the polycrystalline diamond 201 (step 102). Referring to FIG. 2(b), the metallized polycrystalline diamond 201 is grooved with a laser, so that grooves 202 are vertically and horizontally formed on the upper surface of the polycrystalline diamond 201 (step 103). Referring to FIG. 2(c), the grooved polycrystalline diamond 201 is mechanically divided along the grooves 202, thereby forming simultaneously a plurality of diamond heat sinks 203 (step 104).

Referring again to FIGS. 1(a) and 2(a) to 2(c), a second process of manufacturing diamond heat sinks is now described. Referring to FIG. 2(a), a polycrystalline diamond 201 is prepared by chemical vapor deposition (step 101). Referring to FIG. 2(b), this polycrystalline diamond 201 is grooved with a laser, so that grooves 202 are vertically and horizontally formed on the upper surface of the polycrystalline diamond 201 (step 112). The grooved polycrystalline diamond 201 is metallized, so that a metallized film is formed over the entire surface of the polycrystalline diamond 201 (step 113). Referring to FIG. 2(c), the metallized polycrystalline diamond 201 is mechanically divided along the grooves 202, thereby forming simultaneously a plurality of diamond heat sinks 203 (step 104).

The structure of a diamond heat sink manufactured by the aforementioned method will now be described.

Figure 1A:
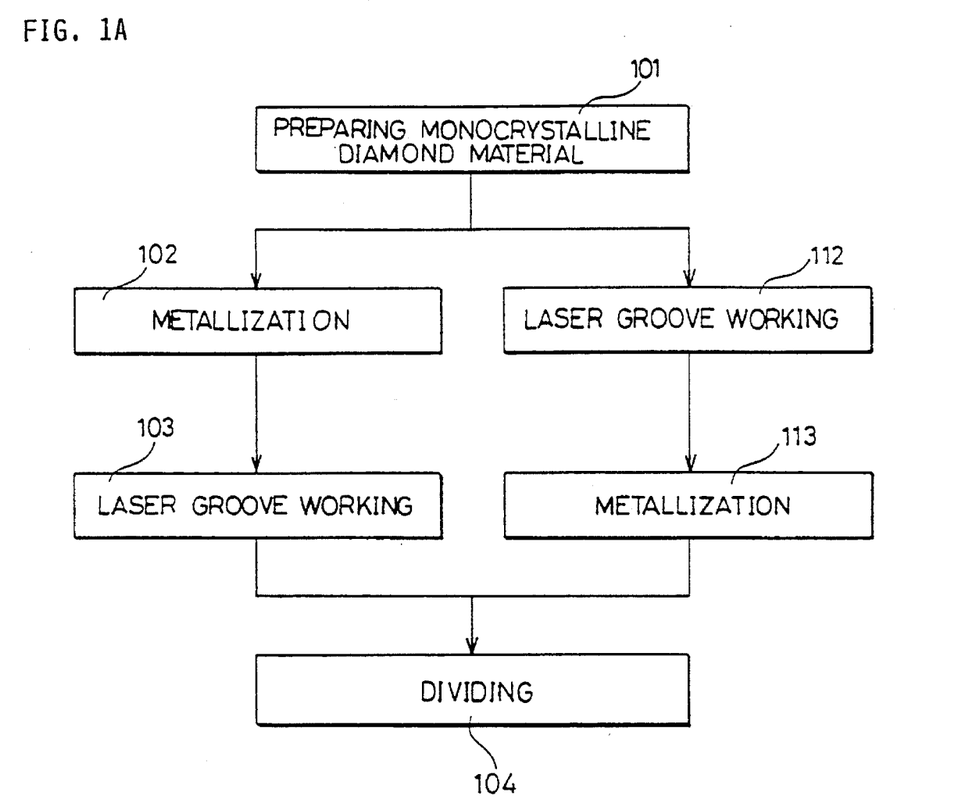
FIG. 1(a) is a process diagram schematically showing a method of manufacturing a diamond heat sink according to the present invention.
Figure 1B:
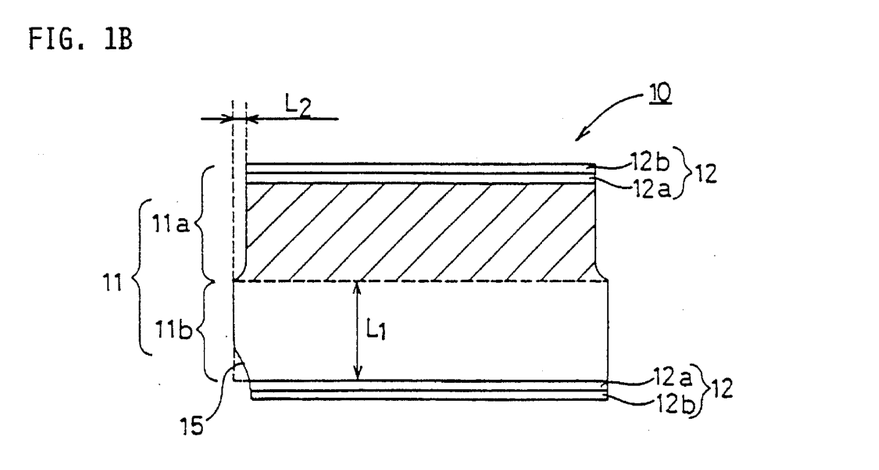
FIG. 1(b) is a side elevational view schematically showing the structure of the diamond heat sink which is manufactured according to the method of the invention.
Figure 3:
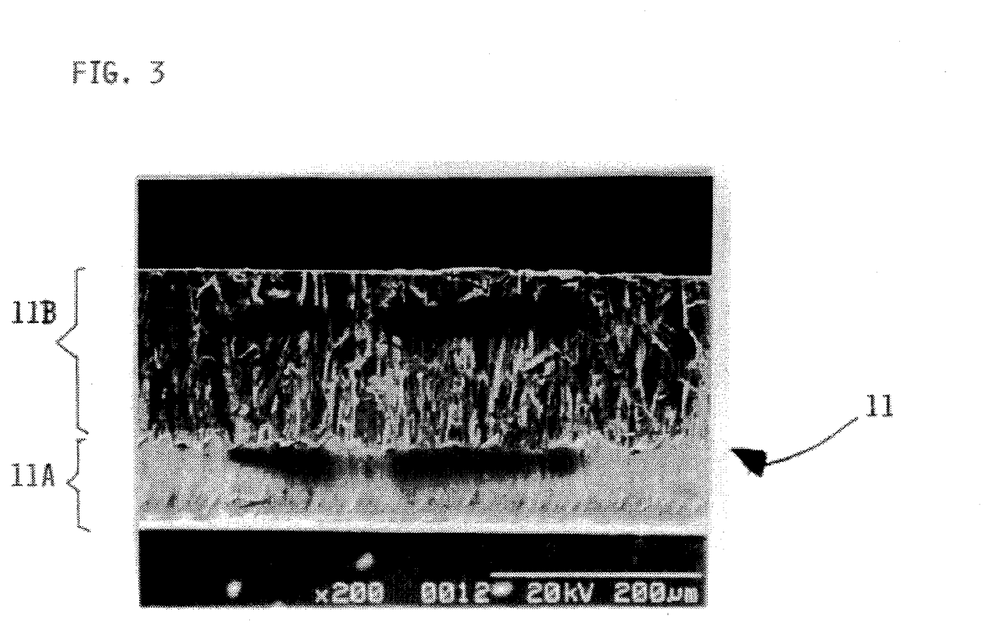
FIG. 3 illustrates the structure of a diamond heat sink according to the present invention.

Referring to FIGS. 1(b) and 3, a diamond heat sink 10 includes a polycrystalline diamond 11 and metallized films 12. The polycrystalline diamond 11 has a first layer 11a which is grooved with a laser and a mechanically divided second layer 11b. The first layer 11a is heated when the same is worked with the laser, whereby graphite is generated around its outer peripheral surface to adhere to the same. On the other hand, the second layer 11b is mainly composed of columnar crystals, due to the preparation by vapor deposition. Upon mechanical division, therefore, the polycrystalline diamond 11 is parted by cleavage along (111) planes of the crystals and by rupture along grain boundaries. Thus, the outer peripheral surface of the second layer 11b is larger in surface roughness than that of the first layer 11a. In more concrete terms, the first and second layers 11a and 11b have a surface roughness of about 5 µm and 10 µm, respectively.

The second layer 11a has a thickness $L_1$ in a range of at least 0.03 mm and not more than 0.3 mm. On the other hand, the portion of the first layer removed by grooving with the laser has a thickness $L_2$ in a range of at least 5 µm and not more than 20 µm.

An edge of the second layer 11b may be chipped by the mechanical division, to cause a defective portion 15. The present method assures that defective portion 15 has a size of not more than 50 µm.

Each of the metallized films 12 is preferably formed by a plurality of films including a first film 12a and a second film 12b.

The first film 12a is made of at least one element selected from Ti, Cr, W and Ni as an element film, an alloy film or a multilayer film of the same.

The second film 12b is made of at least one element selected from Pt, Pd, Ni, Mo, Au, Ag, Cu, Sn, In, Ge and Pb as an element film, an alloy film or a multilayer film of the same.

FIG. 3 is a side elevational view showing a polycrystalline diamond which is grooved with a laser and thereafter mechanically divided. This polycrystalline diamond is not yet metallized on the side faces.

Figure 4:
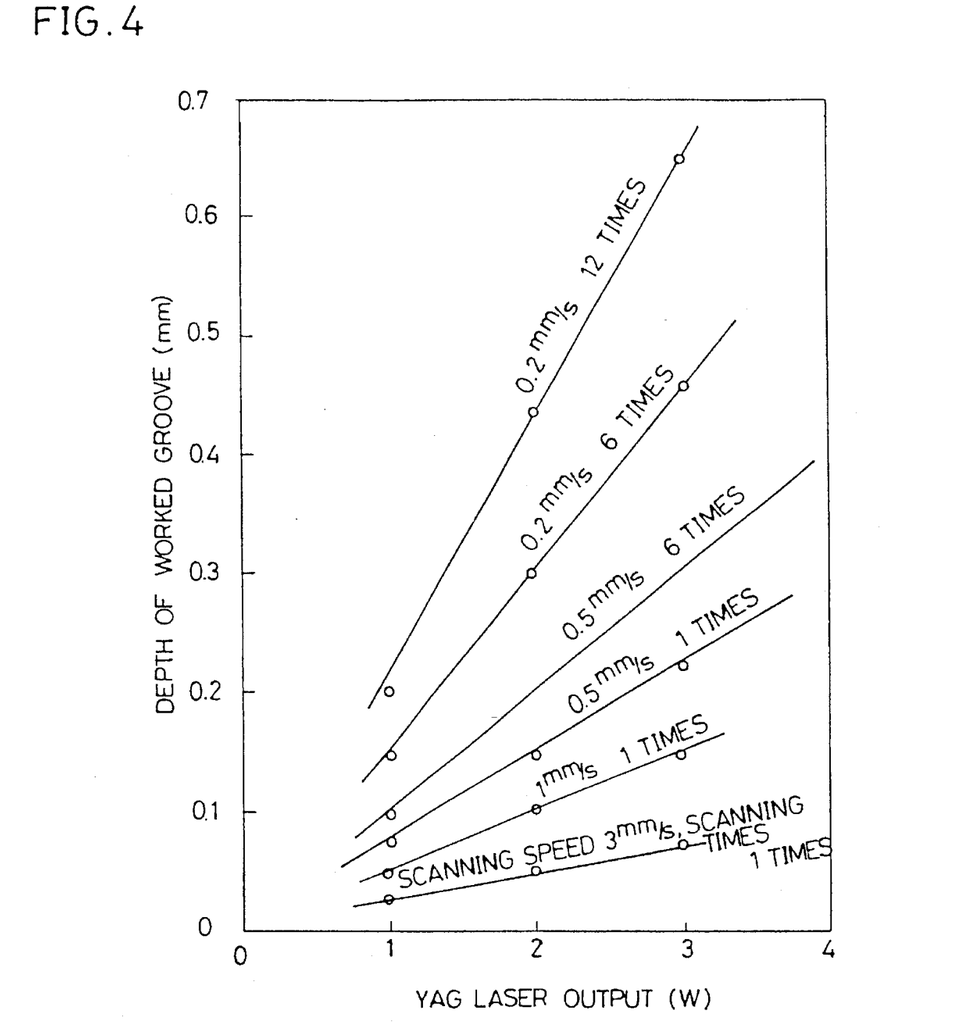
FIG. 4 is a graph showing the depths of cut grooves as a function of the output power of the laser beam used for machining the grooves under the shown conditions for a polycrystalline diamond which is synthesized by hot filament CVD.

Relations between the laser beam machining conditions employed for manufacturing the diamond heat sink and the depths of the worked grooves will now be described with reference to FIG. 4. The depths of the cut grooves are increased as the scanning speed is reduced or the number of scanning times is increased under the same laser outputs. The just described relationships between the laser beam machining conditions and the depths of the cut grooves as just described with reference to FIG. 4 for a polycrystalline diamond which is synthesized by a hot filament method are similar for a monocrystalline diamond which is synthesized by high pressure synthesis.

An example of the present method of manufacturing a diamond heat sink will now be described. First, a polycrystalline diamond was synthesized by microwave plasma CVD. The diamond dimensions were: 25.4 mm by 25.4 mm with a thickness of 0.3 mm. This polycrystalline diamond was finished to a thickness of 0.25 mm by grinding. The surfaces of the as-ground polycrystalline diamond were metallized by vapor-depositing T, Pt and Au in this order, to a thickness of 600 Å, 800 Å and 1000 Å respectively. One of the metallized surfaces of the polycrystalline diamond was grooved with a YAG laser to form a lattice with pitches of 0.77 mm. The polycrystalline diamond was cut or grooved at an output of 3 W, a Q-switching frequency of 3 KHz and a scanning speed of 1 mm/s by scanning but once. The as-formed grooves were 0.15 mm in depth.

Then, a wedge of stainless steel was driven into the grooves of the polycrystalline diamond, to pressurize the same. Due to such pressurization, the polycrystalline diamond was easily cut along the grooves to simultaneously form a plurality of heat sinks.

With the aforementioned process, polycrystalline diamond heat sinks were obtained whereby each had a dimension of 0.75 mm by 0.75 mm with a thickness of 0.25 mm, having upper and bottom surfaces covered with Ti—Pt—Au metallized films. In the process of manufacturing such polycrystalline diamond heat sinks, the maximum size of defective portions which were caused in edges of the heat sinks was 30 µm, while the working yield was 100%. The electric resistance across the upper and lower metallized films of each diamond heat sink was $5 \times 10^8 \Omega$. The polycrystalline diamond employed in this Example had a specific resistance of $5 \times 10^9$ $\Omega \cdot$cm, and a thermal conductivity of 15 w/cm·K at a temperature of 25° C.

The structure of a diamond heat sink completed by the aforementioned method will now be described.

Figure 5:
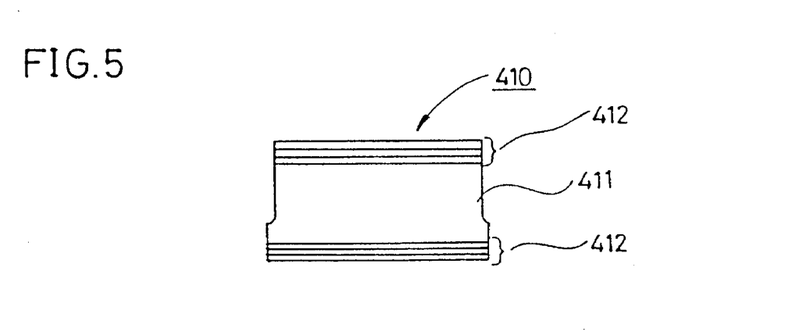
FIG. 5 is a side elevational view schematically showing the structure of a diamond heat sink according to an Example of the present invention.

Referring to FIG. 5, a diamond heat sink 410 is formed by a polycrystalline diamond 411 and metallized films 412 which are formed on upper and bottom main surfaces of the polycrystalline diamond 411. Each of the metallized films 412 is made of Ti, Pt and Au in this order on a main surface of the polycrystalline diamond 411, whereby a diamond heat sink according to Example of the present invention has been formed.

On the other hand, a material of 0.25 mm in thickness was prepared from a monocrystalline diamond which was synthesized by high pressure synthesis. This monocrystalline diamond was metallized and worked with a laser under the same conditions as the above. As the result, grooves of 0.15 mm in depth were formed similarly to the case of the polycrystalline diamond. However, this monocrystalline diamond was easy to crack with defective portions of at least 100 µm and hard to cut, with an inferior working yield of 10%.

Another Example of the present method of manufacturing a diamond heat sink will now be described.

A polycrystalline diamond was synthesized by a hot filament method, in dimensions of 50.8 mm by 50.8 mm with a thickness of 0.8 mm. This polycrystalline diamond was finished to a thickness of 0.635 mm by grinding. Upper and lower surfaces of the so ground polycrystalline diamond were grooved with a YAG laser. Thus, grooves were formed in the upper and bottom surfaces of the polycrystalline diamond with pitches of 20.1 mm, at a laser output of 2.5 W, a Q-switching frequency of 3 KHz and a working speed of 0.5 mm/s by six scanning times. The upper and bottom grooves were displaced by 10 µm from each other, with depths of 0.25 mm from the upper and bottom surfaces respectively.

The upper and bottom surfaces of the grooved polycrystalline diamond were metallized with Ti, Mo, Ni and Au in this order by sputtering, in thicknesses of 600 Å, 800 Å, 1000 Å and 5000 Å respectively. Then, either one of the metallized upper and bottom surfaces of the polycrystalline diamond was covered with a metallized film of an Au/Sn eutectic alloy by physical vapor deposition. The thickness of the metallized film of the Au/Sn eutectic alloy was 3 µm.

A lattice-shaped metal jig, which was prepared in accordance with the shapes of the grooves, was introduced into the grooves of the metallized polycrystalline diamond, to pressurize the same. Due to such pressurization, the polycrystalline diamond was easily cut along the grooves, to obtain simultaneously a plurality of polycrystalline diamond heat sinks.

The electric resistance across the upper and bottom metallized films of each diamond heat sink was $1 \times 10^7 \Omega$. The maximum size of defective portions which were caused in the edges of the diamond heat sinks was 20 µm. The polycrystalline diamond employed in this Example had an electric resistivity resistance of $2 \times 10^9$ $\Omega \cdot$cm and a thermal conductivity of 10 W/cm·K at a temperature of 100° C.

The structure of a diamond heat sink completed in the aforementioned manufacturing method will now be described.

Figure 6:
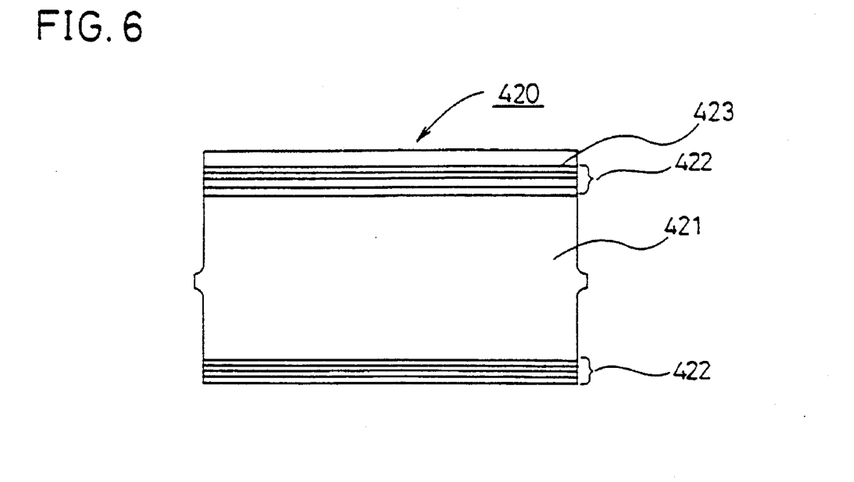
FIG. 6 is a side elevational view schematically showing the structure of a diamond heat sink according to another Example of the present invention.

Referring to FIG. 6, a diamond heat sink 420 is formed by a polycrystalline diamond 421, metallized films 422 and a metallized film 423 of an Au/Sn eutectic alloy. The metallized films 422 are formed on upper and bottom surfaces of the polycrystalline diamond 421. Each of the metallized films 422 is formed by four layers of Ti, Mo, Ni and Au in this order on a side of the polycrystalline diamond 421. Either one of the upper and bottom surfaces, which are provided with the metallized films 422, of the polycrystalline diamond 421 is covered with the metallized film 423 of an Au/Sn eutectic alloy.

As to a monocrystalline diamond which is synthesized by high pressure synthesis, it is impossible to synthesize a material having dimensions of 20 mm by 20 mm with a thickness of 0.635 mm by present technology. When upper and bottom surfaces of a material of 4 mm by 4 mm having a thickness of 0.635 mm were worked with a laser to be subjected to a cutting test, it was impossible to cut the same due to cracks formed in the cut portions.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A diamond heat sink comprising a polycrystalline diamond substrate synthesized by chemical vapor deposition and having a pair of opposite main surfaces that are electrically insulated from each other, wherein said polycrystalline diamond substrate comprises a first layer and a second layer provided between said pair of main surfaces, wherein said first layer has a first outer peripheral surface having a first surface roughness and having graphite adhering thereto, and wherein said second layer has a second outer peripheral surface having a second surface roughness greater than said first surface roughness.

2. The diamond heat sink of claim 1, wherein said second layer has an edge along an intersection of said second outer peripheral surface and one of said main surfaces, and said edge includes no defects more than 50 µm in size.

3. The diamond heat sink of claim 1, wherein said second layer has a thickness direction substantially perpendicular to said main surfaces, and has an electric resistance along said thickness direction which is at least $1 \times 10^6 \Omega$.

4. The diamond heat sink of claim 1, wherein an electric resistance across said pair of main surfaces is at least $1 \times 10^6 \Omega$.

5. The diamond heat sink of claim 1, wherein said second layer has a thickness of at least 0.03 mm and not more than 0.3 mm.

6. The diamond heat sink of claim 1, wherein said polycrystalline diamond substrate has an electrical resistivity of at least $10^9$ $\Omega \cdot$cm.

7. The diamond heat sink of claim 1, wherein said polycrystalline diamond substrate has a thermal conductivity of at least 5 W/cm·K and not more than 20 W/cm·K at room temperature.

8. The diamond heat sink of claim 1, further comprising a metallized film arranged on at least a portion of at least one of said main surfaces.

9. The diamond heat sink of claim 8, wherein said metallized film comprises a first film layer arranged on said one of said main surfaces and a second film layer arranged on said first film layer.

10. The diamond heat sink of claim 9, wherein said first film layer comprises at least one element selected from the group consisting of Ti, Cr, W and Ni, and wherein said second film layer comprises at least one element selected from the group consisting of Pt, Pd, Ni, Mo, Au, Ag, Cu, Sn, In, Ge, Sn and Pb.

11. The diamond heat sink of claim 10, wherein said second layer is mainly composed of columnar diamond crystals.

12. The diamond heat sink of claim 11, wherein said columnar diamond crystals have a grain diameter not more than 50 μm.

13. The diamond heat sink of claim 1, wherein said second outer peripheral surface of said second layer does not have graphite adhering thereto.

14. The diamond heat sink of claim 1, wherein said second surface roughness is about 10 μm and said first surface roughness is about 5 μm.

15. The diamond heat sink claim 1, wherein said first outer peripheral surface is a laser cut surface, and wherein said second outer peripheral surface is a mechanically broken surface including cleavage along (111) planes of crystals of said polycrystalline diamond substrate and rupture along grain boundaries of said crystals.

16. The diamond heat sink of claim 1, wherein said first and second outer peripheral surfaces respectively define substantially parallel planes spaced from 5 μm to 20 μm apart from each other, with said second peripheral surface protruding outwardly beyond said first peripheral surface, and wherein said first and second outer peripheral surfaces together form a peripheral surface of said heat sink extending between said main surfaces.

17. The diamond heat sink of claim 1, wherein said polycrystalline diamond substrate further comprises a third layer provided between said pair of main surfaces, with said second layer arranged between said first and third layers, and wherein said third layer has a third outer peripheral surface having a third surface roughness greater than said first surface roughness and having graphite adhering thereto.

18. The diamond heat sink of claim 17, further comprising a first metallized film arranged on a first one of said main surfaces and a second metallized film arranged on a second one of said main surfaces.

19. The diamond heat sink of claim 18, wherein each of said first and second metallized films comprises respective layers of Ti, Mo, Ni and Au, and further comprising a metallized cover film of an Au/Sn eutectic alloy arranged on at least one of said first and second metallized films.

20. A diamond heat sink comprising a polycrystalline diamond substrate including a first layer and a second layer and having first and second opposite main surfaces that are electrically insulated from each other, a first metallization layer arranged on said first main surface and a second metallization layer arranged on said second main surface, wherein said first and second metallization layers are electrically insulated from each other, said first layer has are electrically insulated from each other, said first layer has a first outer peripheral surface having a first surface roughness and having graphite adhering thereto, and said second layer has a second outer peripheral surface having a second surface roughness greater than said first surface roughness.

\* \* \* \* \*

UNITED STATES PATENT AND TRADEMARK OFFICE
CERTIFICATE OF CORRECTION

PATENT NO. : 5,495,126
DATED : Feb. 27, 1996
INVENTOR(S) : Iguchi et al.

It is certified that error appears in the above-identified patent and that said Letters Patent is hereby corrected as shown below:

Column 2:
  line 55, replace "3-138106 (1990)" by --3-138106 (1991)--.

Column 6, line 24, after "that" insert --the--.
Column 9, claim 11, line 1, replace "claim 10" by --claim 1--.
Column 10, claim 20, line 8, delete "said first layer has are";
        claim 20, line 9, delete "electrically insulated from each other,".

Signed and Sealed this

Twenty-fifth Day of June, 1996

Attest:

BRUCE LEHMAN

Attesting Officer    Commissioner of Patents and Trademarks